United States Patent
Lung

(10) Patent No.: US 6,838,692 B1
(45) Date of Patent: Jan. 4, 2005

(54) CHALCOGENIDE MEMORY DEVICE WITH MULTIPLE BITS PER CELL

(75) Inventor: Hsiang-Lan Lung, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/600,530

(22) Filed: Jun. 23, 2003

(51) Int. Cl.⁷ .............................................. H01L 47/00
(52) U.S. Cl. ..................... 257/4; 257/2; 257/3; 257/5
(58) Field of Search ......................................... 257/2–5

(56) References Cited

U.S. PATENT DOCUMENTS

| | | | |
|---|---|---|---|
| 5,166,758 A | * 11/1992 | Ovshinsky et al. | ............ 257/3 |
| 5,296,716 A | 3/1994 | Ovshinsky et al. | |
| 5,789,758 A | * 8/1998 | Reinberg | ........................ 257/3 |
| 6,114,713 A | * 9/2000 | Zahorik | ......................... 257/4 |
| 6,147,395 A | 11/2000 | Gilgen | |
| 6,189,582 B1 | * 2/2001 | Reinberg et al. | ............ 438/239 |

* cited by examiner

Primary Examiner—David Nelms
Assistant Examiner—Andy Huynh
(74) Attorney, Agent, or Firm—Birch, Stewart, Kolasch & Birch, LLP

(57) ABSTRACT

A memory device with multiple bits per-cell. The memory device includes a side electrode; a doped semiconductor region disposed laterally in contact with a sidewall of the side electrode, such that the doped semiconductor region forms a diode, or the junction between the side electrode and the doped semiconductor region forms a diode; a layer of phase-changing material disposed laterally in contact with a sidewall of the doped semiconductor region, such that the doped semiconductor region is disposed between the layer of phase-changing material and the side electrode; and an upper electrode disposed on the layer of phase-changing material. Many storage regions can be stacked vertically, and multiple bits can be stored in one cell. Also, the contact area is reduced to a minimum dimension below the photo-lithographic limit.

16 Claims, 13 Drawing Sheets

CHALCOGENIDE MEMORY DEVICE WITH MULTIPLE BITS PER CELL

BACKGROUND OF THE INVENTION

1. Field of the Invention

The present invention relates to a chalcogenide memory device, and more particularly to a chalcogenide memory device with multiple bits per cell.

2. Description of the Prior Art

The use of chalcogenide material in memory devices is well known in the art. For example, Ovshinsky et al. in U.S. Pat. No. 5,296,716 disclose the use of chalcogenide materials and provide a discussion of the current theory of operation of chalcogenide materials.

Chalcogenide material can be electrically switched between amorphous and crystalline states and exhibits different electrical characteristics depending upon its state. For example, in its amorphous state, the material exhibits lower electrical conductivity than it does in its crystalline state. Because chalcogenide material retains its programmed state even after removal of the electrical stimulus, chalcogenide memories are non-volatile. As an added benefit, chalcogenide elements may be programmed into two or more states. Thus, chalcogenide-based memories may operate as traditional binary memories or as higher-based memories.

The operation of chalcogenide memory cells requires that a region of the chalcogenide memory material, called the chalcogenide active region, be subjected to a current pulse typically with a current density between about $10^5$ to $10^7$ amperes/cm$^2$, to change the crystalline state of the chalcogenide material within the active region contained within a small pore. Referring to FIG. 1, this current density may be accomplished by first creating a small opening 1 in a dielectric material 2 which is itself deposited onto a lower electrode material 3. A second dielectric layer 4, typically of silicon nitride, is then deposited onto the dielectric layer 2 and into the opening 1. The chalcogenide material 5 is then deposited over the second dielectric material 4 and into the opening 1. An upper electrode material 6 is then deposited over the chalcogenide material 5. Carbon is a commonly used electrode material although other materials have also been used, for example, molybdenum and titanium nitride. A conductive path is then provided from the chalcogenide material 5 to the lower electrode material 3 by forming a pore 7 in the second dielectric layer 4 by the well known process of popping. Popping involves passing an initial high current pulse through the structure which passes through the chalcogenide material 5 and then provides dielectric breakdown of the second dielectric layer 4 thereby providing a conductive path via the pore 7 through the memory cell.

The energy input required to adjust the crystalline state of the chalcogenide active region of the memory cell is directly proportional to the lateral dimension of the pore. That is to say, smaller pore sizes result in smaller energy input requirement. Conventional chalcogenide memory cell fabrication techniques provide a minimum lateral pore dimension limited by the photolithographic size limit. This results in pore sizes having minimum lateral dimensions down to approximately 1 micron.

Many researchers have attempted to solve the above problem. For example, Gilgen in U.S. Pat. No. 6,147,395 provides a chalcogenide memory with a small contact area between the chalcogenide element and electrode. Referring to FIG. 2, the chalcogenide memory includes, from the bottom to top, a substrate 20, a lower electrode 22 with a frusto-conical tip 30, a chalcogenide layer 34 in contact with the frusto-conical tip 30, a carbon layer 35, an upper electrode 36, and an upper conductive grid interconnect 40. Symbol 32 refers to an insulating layer and symbol 38 an interlayer dielectric (ILD) layer. Since the lower electrode 22 has a frusto-conical tip 30, the contact area between the chalcogenide layer 34 and the lower electrode 22 is made small. The small contact area provides minimum dimensions below the photolithographic limit, thereby reducing the required energy input to the chalcogenide active region in operation.

However, the conventional chalcogenide memory can store only one bit on one cell, thus, the memory density is not sufficient.

SUMMARY OF THE INVENTION

An object of the present invention is to solve the above-mentioned problems and provide a chalcogenide memory with multiple bits per cell. In the chalcogenide memory of the present invention, the side electrode, diode, chalcogenide layer, and upper electrode are disposed laterally. Therefore, a single storage region occupies a smaller vertical space compared with conventional chalcogenide memory. Thus, according to the present invention, many storage regions can be stacked vertically. Thus, multiple bits can be stored in one cell and the memory has super high memory density.

Another object of the present invention is to provide an energy-saving chalcogenide memory. The contact area between the chalocogenide layer and electrode is controlled by the thickness of the diode. Thus, the contact area is reduced to a minimum dimension below the photolithographic limit. This can reduce the required energy input to the chalcogenide active region in operation.

To achieve the above object, according to a first aspect of the present invention, the memory device of the present invention includes a side electrode; a doped semiconductor region disposed laterally in contact with a sidewall of the side electrode, such that the doped semiconductor region forms a diode, or the junction between the side electrode and the doped semiconductor region forms a diode; a layer of phase-changing material disposed laterally in contact with a sidewall of the doped semiconductor region, such that the doped semiconductor region is disposed between the layer of phase-changing material and the side electrode; and an upper electrode disposed on the layer of phase-changing material.

When the doped semiconductor structure forms a diode, it can be a PN junction diode. The side electrode can be metal, such as a tungsten plug.

When the junction between the side electrode and the doped semiconductor region forms a diode, the side electrode can be doped polysilicon having a different conductive type from the doped semiconductor region to form a PN junction diode with the doped semiconductor region. The side electrode can be a doped polysilicon plug. Or, alternatively, the side electrode is metal, such as a tungsten plug, to form a Schottky diode with the doped semiconductor region.

According to a second aspect of the present invention, the memory device of the present invention includes a first side electrode; a second side electrode; and a storage region laterally disposed between the first and second side electrodes.

The storage region includes a first doped semiconductor region disposed laterally in contact with a sidewall of the first side electrode, such that the first doped semiconductor structure forms a diode, or the junction between the first side electrode and the first doped semiconductor region forms a diode; a second doped semiconductor region disposed laterally in contact with a sidewall of the second side electrode, such that the second doped semiconductor region forms a diode, or the junction between the second side electrode and the second doped semiconductor region forms a diode; a layer of phase-changing material disposed laterally between and in contact with the first and second doped semiconductor regions; and an upper electrode disposed on the layer of phase-changing material.

According to a third aspect of the present invention, the memory device of the present invention includes a first side electrode; a second side electrode; and a plurality of the storage regions disposed between the first and second side electrodes, stacked vertically, and separated from each other by a dielectric layer.

According to a fourth aspect of the present invention, there is provided a process for fabricating a memory device with multiple bits per cell. A conductive layer is formed on a semiconductor substrate. A dielectric layer is formed on the conductive layer.

Subsequently, a storage region is formed, including the following steps. A doped semiconductor structure is formed on the dielectric layer. An insulating layer is formed on the doped semiconductor structure and the dielectric layer. The insulating layer is selectively removed downwardly to the underlying doped semiconductor structure to expose the dielectric layer and to separate the doped semiconductor structure into two doped semiconductor regions, thus forming a trench. Next, a layer of phase-changing material is formed in the trench, and an upper electrode is formed on the layer of phase-changing material. The upper electrode and the layer of phase-changing material are planarized to stop on the insulating layer.

Subsequently, the above-mentioned steps of forming a dielectric layer and a storage region are repeated N times to form (N+1) levels of dielectric layers, doped semiconductor regions, insulating layers, layers of phase-changing material, and upper electrodes, wherein N is an integer equal to or greater than 0.

Subsequently, (N+1) levels of insulating layers and dielectric layers are selectively removed to expose the sides of the (N+1) levels of doped semiconductor regions and the top surface of the conductive layer, thus forming two openings. The two openings are filled with a conductive material to form two conductive plugs. In the memory device, each of the doped semiconductor regions forms a diode, or the junction between the conductive plug and the doped semiconductor region forms a diode.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 1:
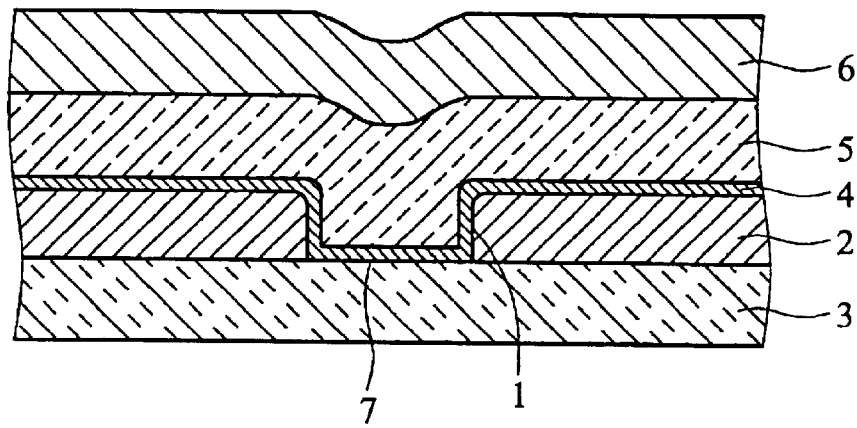
FIG. 1 is a cross-section of a conventional chalcogenide memory.
Figure 2:
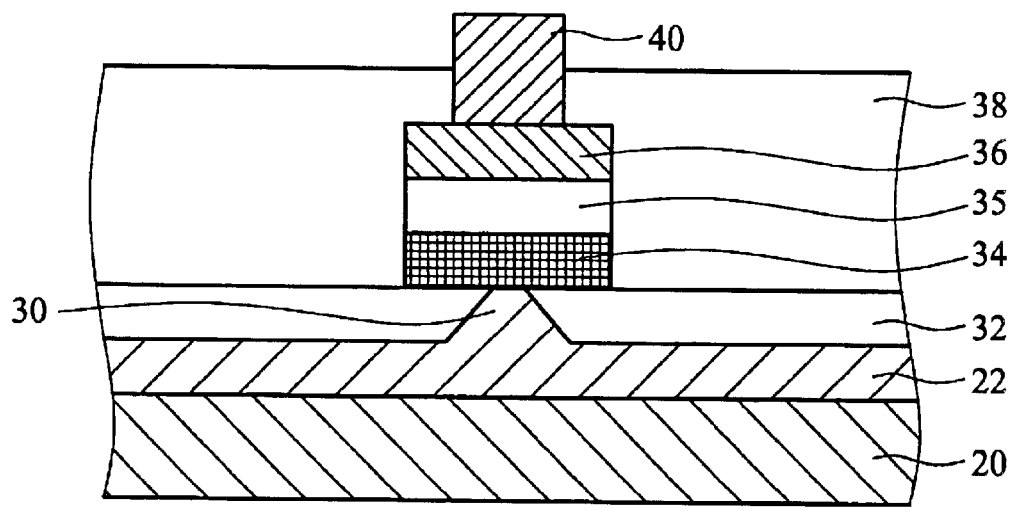
FIG. 2 is a cross-section of another conventional chalcogenide memory.
Figure 3A:
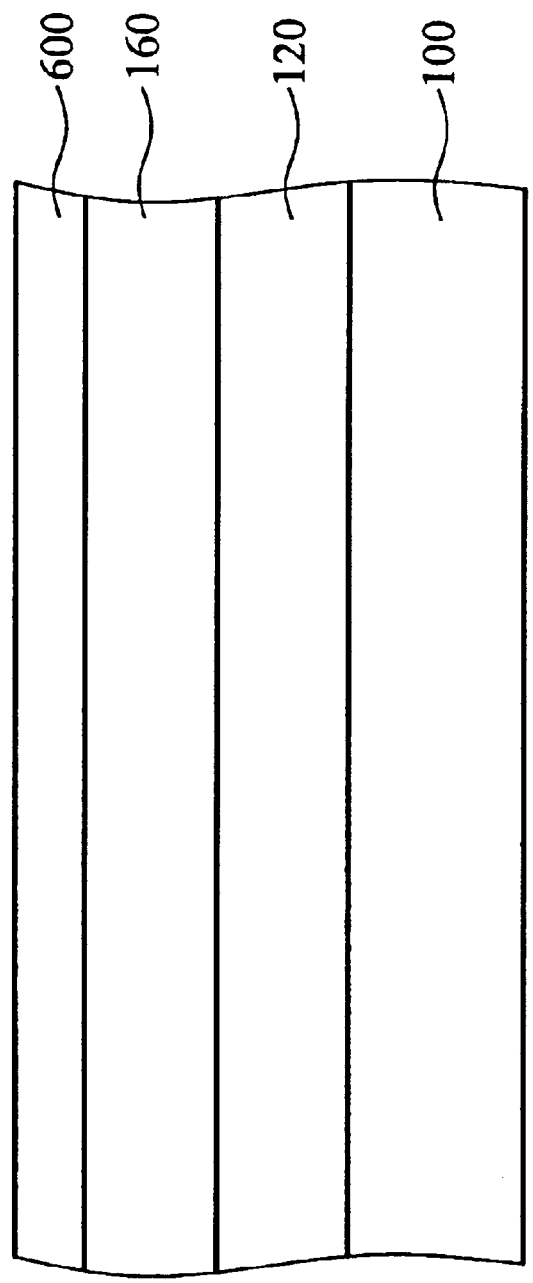
FIGS. 3a to 3h are cross-sections showing the process flow of fabricating a chalcogenide memory according to an embodiment of the present invention.
Figure 3B:
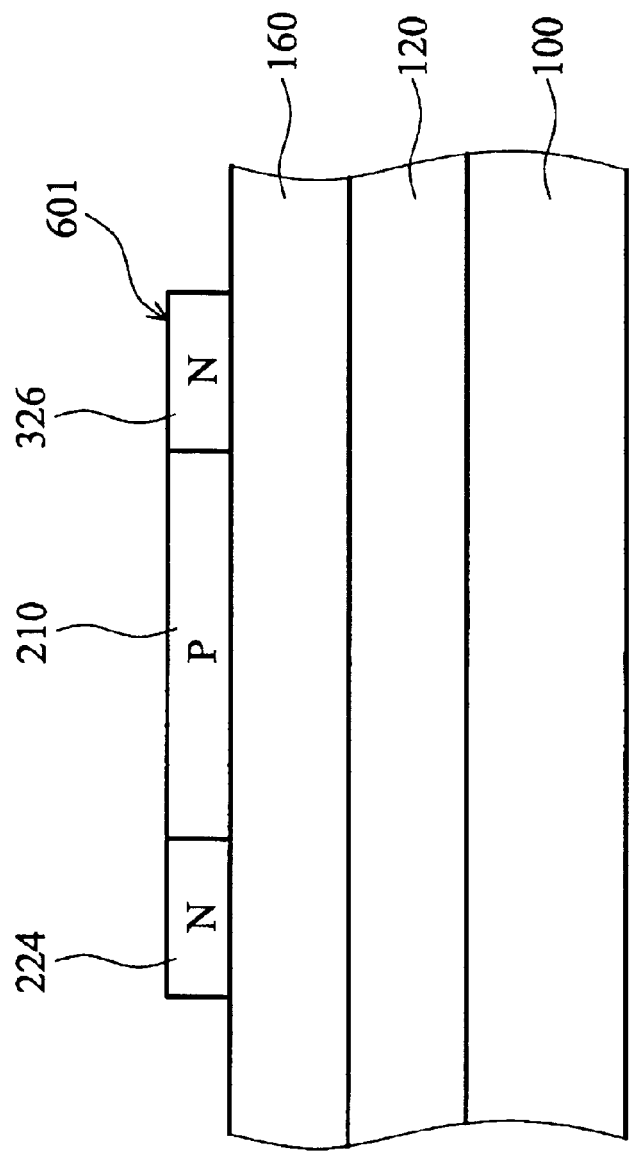
Figure 3C:
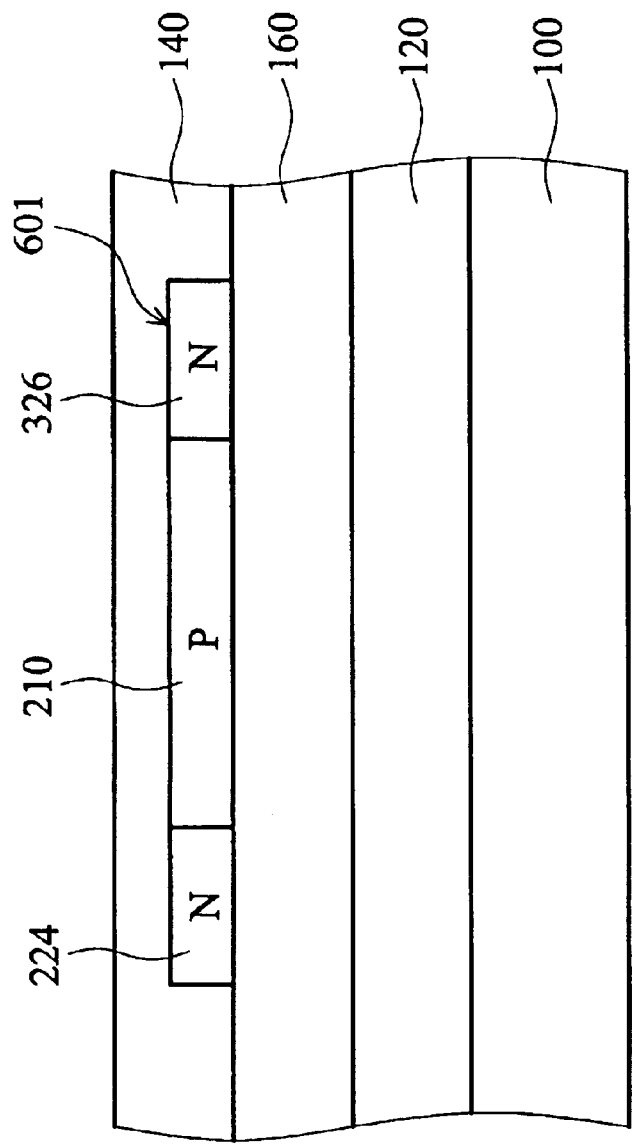
Figure 3D:
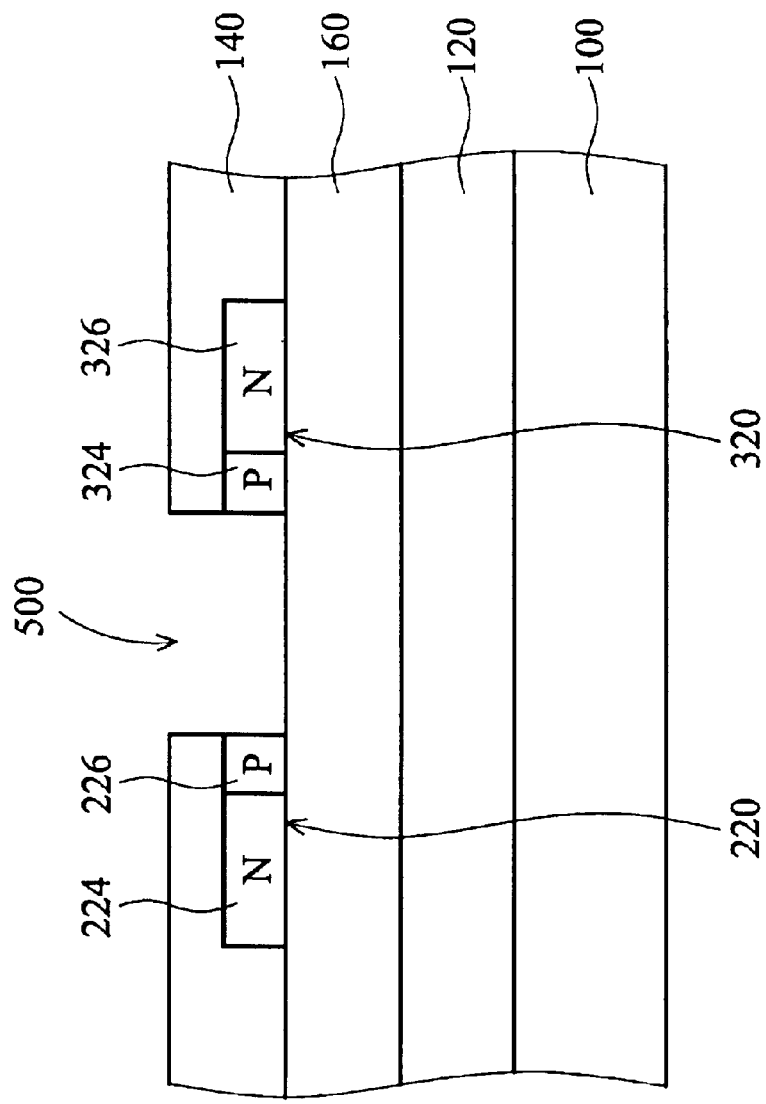
Figure 3E:
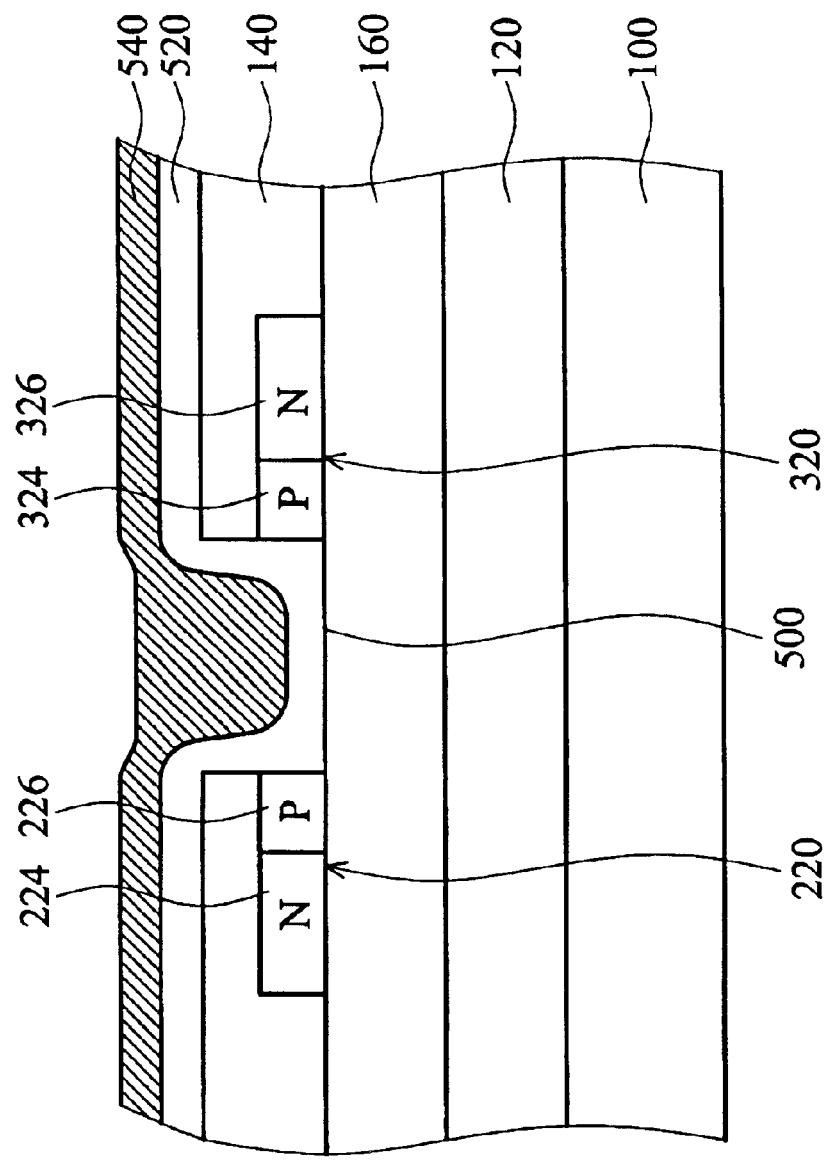
Figure 3F:
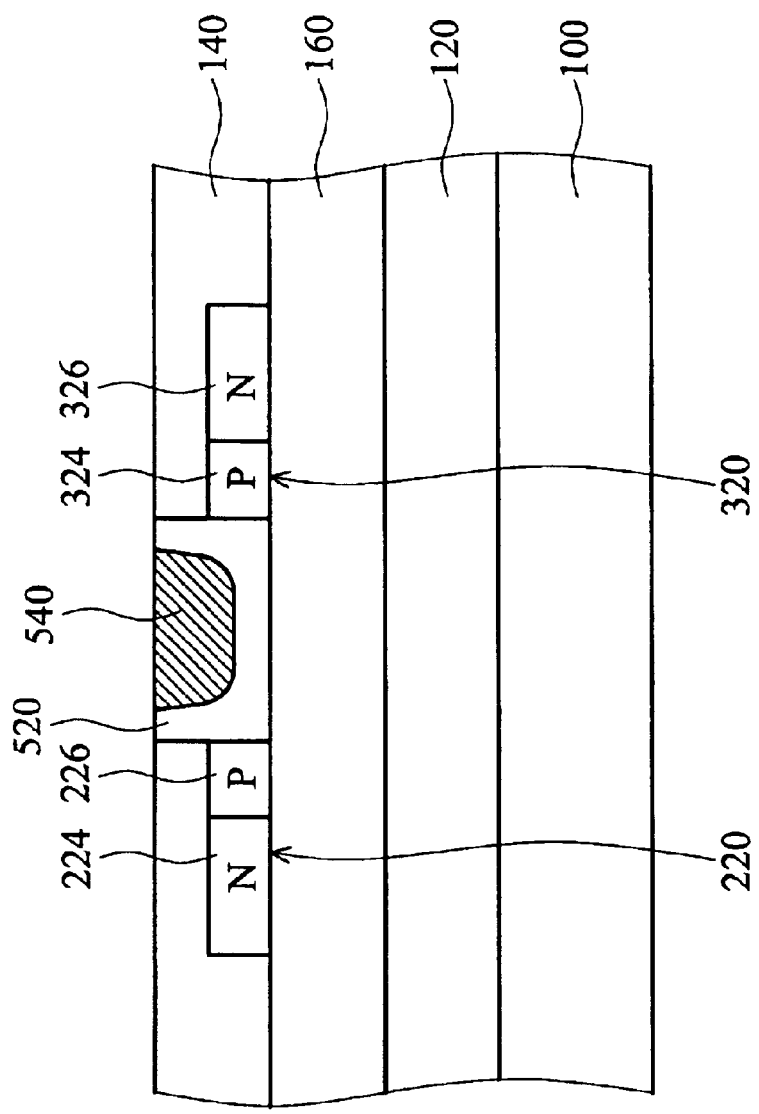
Figure 3G:
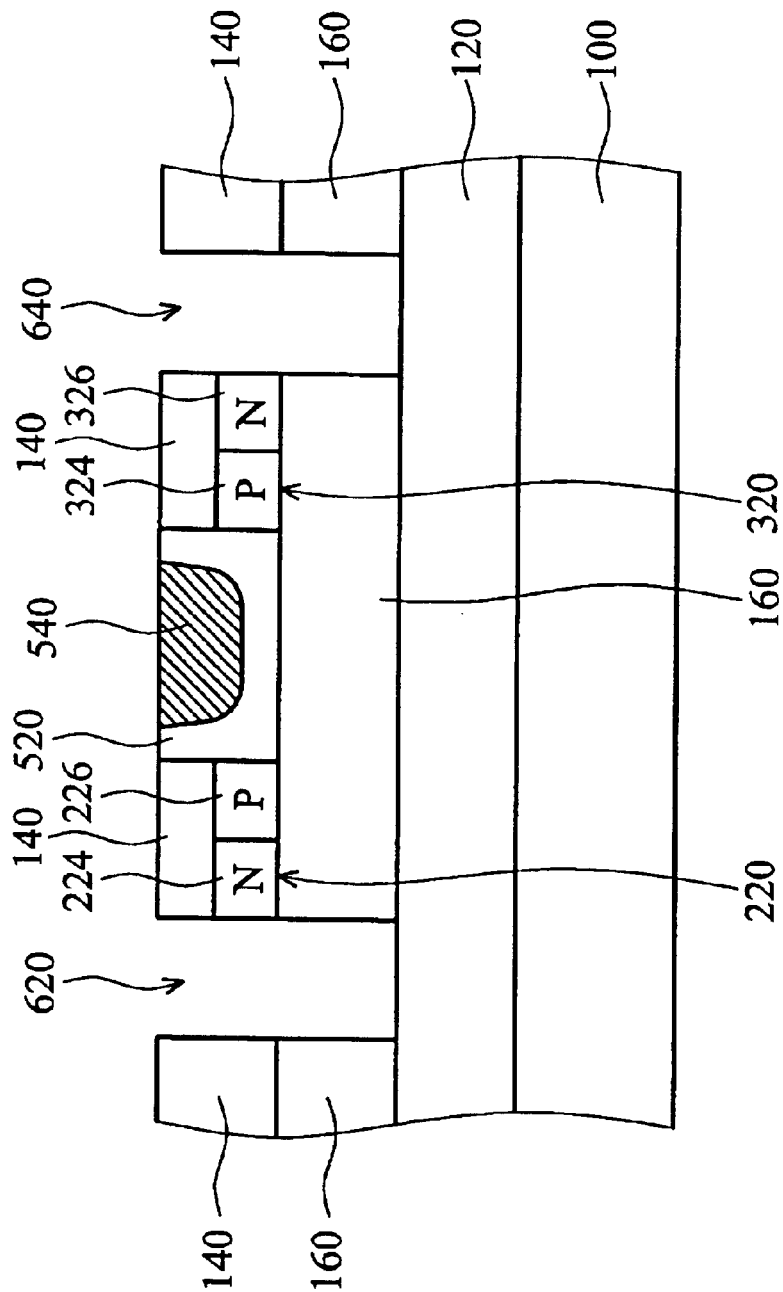
Figure 3H:
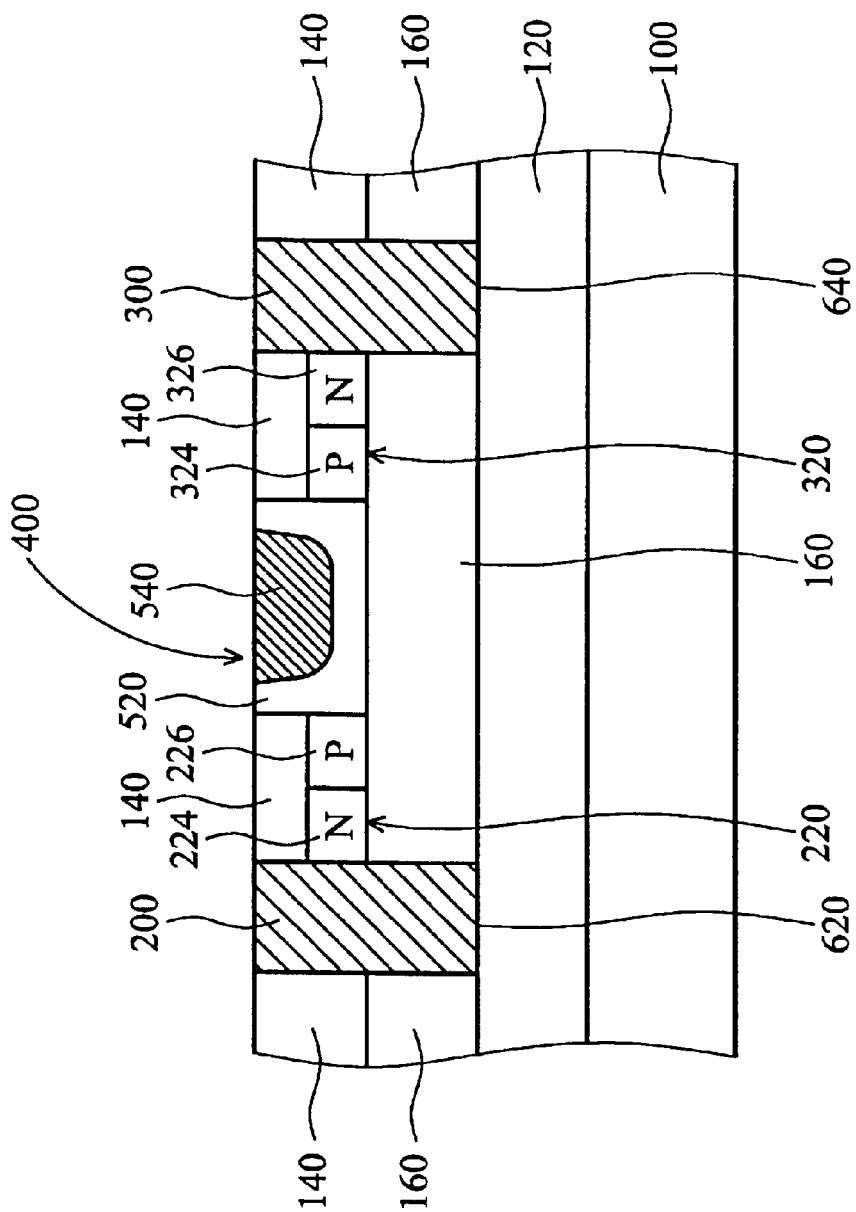

FIG. 3h shows a cross-section of a chalcogenide memory according to an embodiment of the present invention. Symbol 100 refers to a semiconductor substrate, and symbol 120 a conductive layer, for example, a polysilicon or tungsten word line. A memory device, including a first side electrode 200, a second side electrode 300, and a storage region 400, is formed on the word line 120. A dielectric layer 160 is disposed on the word line 120 to isolate the word line 120 and storage region 400.

The first side electrodes 200 and 300 can be made of metal, for example, a tungsten plug. The storage region 400 is laterally disposed between the first and second side electrodes 200 and 300. The storage region 400 includes a first doped semiconductor region 220, a second doped semiconductor region 320, a layer of phase-changing material 520, and an upper electrode 540.

The first doped semiconductor region 220 is disposed laterally in contact with a sidewall of the first side electrode 200. Also, the first doped semiconductor region 220 includes an N-type region 224 and a P-type region 226 to form a PN junction diode.

The second doped semiconductor region 320 is disposed laterally in contact with a sidewall of the second side electrode 300. Also, the second doped semiconductor region 320 includes a P-type region 324 and an N-type region 326 to form a PN junction diode.

The layer of phase-changing material 520 is disposed laterally between and in contact with the first and second doped semiconductor regions 220 and 320 and can be a chalcogenide material. The upper electrode 540 is disposed on the layer of phase-changing material 520 and can be metal. An insulating layer 140 is disposed on sides of the first and second side electrodes 200 and 300, between the first electrode 200 and chalcogenide layer 520, and between the second electrode 300 and chalcogenide layer 520, to prevent undesirable electrical contact.

Now, refer to FIGS. 3a to 3h, illustrating the process flow of fabricating a chalcogenide memory according to an embodiment of the present invention.

Referring to FIG. 3a, a conductive layer 120, a dielectric layer 160, and a semiconductor layer 600 are sequentially formed on a semiconductor substrate 100. The semiconductor layer 600 can be a polysilicon layer. The thickness of the semiconductor layer 600 is the thickness of the doped semiconductor regions 220 and 320 to be formed in the future (see FIG. 3h). This thickness will determine the contact area between the chalocogenide layer 520 and the electrodes 200 and 300 to be formed in the future (see FIG. 3h). By means of conventional thin film deposition, such as chemical vapor deposition (CVD), the semiconductor layer 600 can be formed as thin as possible, even below the photolithographic limit, for example, to a thickness of 10 Å to 1500 Å, preferably 100 Å to 1000 Å. The smaller contact area between the chalcogenide layer and the electrodes can reduce the required energy input to the chalcogenide active region in operation.

Subsequently, referring to FIG. 3b, the semiconductor layer 600 is selectively removed and then doped by implantation to form a doped semiconductor structure 601 including three doped semiconductor structures 224, 326 and 210.

Subsequently, referring to FIG. 3c, an insulating layer 140, such as silicon oxide, is formed on the three doped semiconductor structures 224, 326 and 210 and the dielectric layer 160. Chemical mechanical polishing (CMP) is performed to planarize the surface of the insulating layer 140.

Subsequently, referring to FIG. 3d, the insulating layer 140 is selectively removed downwardly to the underlying doped semiconductor structure 210 to expose the dielectric layer 160 and separate the doped semiconductor structure 601 into first and second doped semiconductor regions 220 and 320. A trench 500 and two doped semiconductor structures 226 and 324 are thus formed. As shown in FIG. 3d, the first doped semiconductor region 220 includes the N-type structure 224 and P-type structure 226, and the second doped semiconductor region 320 includes the N-type structure 326 and P-type structure 324.

Subsequently, referring to FIG. 3e, a chalcogenide layer 520 is formed in the trench 500. The chalcogenide layer 520 may be deposited using conventional thin film deposition methods and can have a thickness of 10 Å to 1000 Å. The chalcogenide can be a composition including at least two of Se (selenium), Te (tellurium), Ge (germanium), and Sb (antimony). For example, the chalcogenide can be $Te_aGe_bSb_{100-(a+b)}$, wherein a, b, and (100−(a+b)) are in atomic percentages. For the atomic ratio of Te, a, the range can be $23\% \leq a \leq 70\%$, preferably $40\% \leq a \leq 60\%$, most preferably $48\% \leq a \leq 56\%$. The atomic ratio of Ge, b, can be in the range of $15\% \leq b \leq 50\%$, preferably $17\% \leq b \leq 44\%$. The remainder is Sb. Next, a conductive layer 540, such as a tungsten layer, is formed on the chalcogenide layer 520, serving as an upper electrode.

Subsequently, referring to FIG. 3f, chemical mechanical polishing is performed to planarize the tungsten layer 540 and chalcogenide layer 520 to stop on the insulating layer 140.

Subsequently, referring to FIG. 3g, the insulating layer 140, the dielectric layer 160 and the doped semiconductor structures 224 and 326 are selectively removed to expose the sides of the two doped semiconductor structures 224 and 326 and the top surface of the polysilicon word line 120, forming two openings 620 and 640.

Subsequently, referring to FIG. 3h, a conductive material such as tungsten is filled into the two openings 620 and 640 to form two conductive plugs 200 and 300.

An important advantage of the present invention is that the contact area between the chalocogenide layer 520 and the side electrode 200 or 300 is controlled by the thickness of the diodes, i.e., the first and second doped semiconductor regions 220 or 320. The thickness of the diode 220 or 320 is the thickness of the polysilicon layer 600 (see FIG. 3a). And the polysilicon layer 600 can be formed to a very thin thickness, even below the photolithographic limit. Thus, the contact area is reduced to a minimum dimension below the photolithographic limit. This can reduce the required energy input to the chalcogenide active region in operation.

Figure 4:
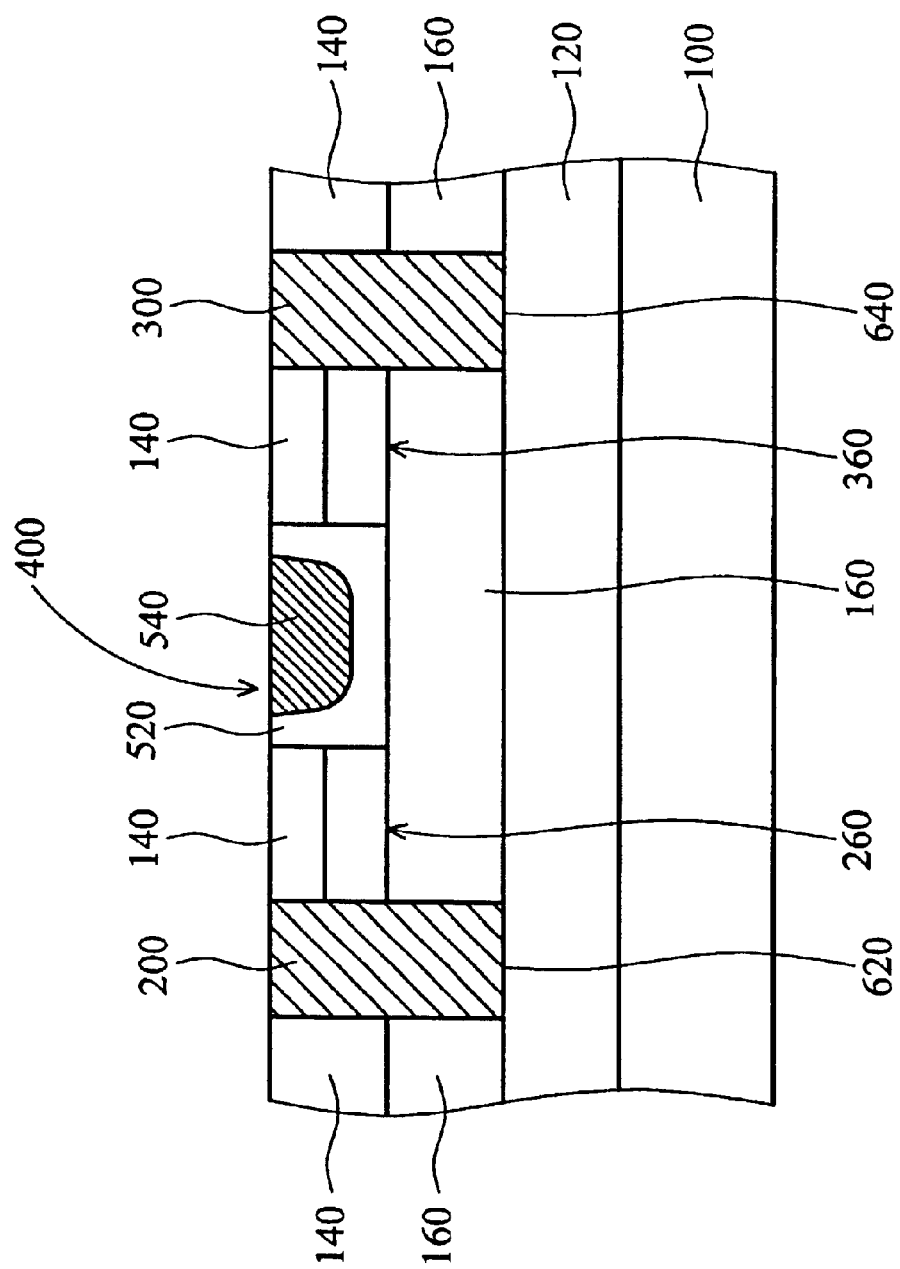
FIG. 4 is a cross-section of a chalcogenide memory according to an embodiment of the present invention.

Refer to FIG. 4, showing a cross-section of a chalcogenide memory according to an embodiment of the present invention. The numerals in FIG. 3h represent the same elements. The structure of FIG. 4 is almost the same as that of FIG. 3h, except that first and second doped semiconductor regions 260 and 360 are different. In FIG. 4, the first and second doped semiconductor regions 260 and 360 are not diodes themselves. Rather, the junction between the first side electrode 200 and the first doped semiconductor region 260 forms a diode, and the junction between the second side electrode 300 and the second doped semiconductor region 360 forms a diode.

For example, the first and second side electrodes 200 and 300 are n-doped polysilicon plugs, and the first and second doped semiconductor regions 260 and 360 are p-doped polysilicon. Thus, two PN junction diodes are formed. Alternatively, the first and second side electrodes 200 and 300 are metal, such as tungsten plugs, and the first and second doped semiconductor regions 260 and 360 are n- or p-doped polysilicon. Thus, two Schottky diodes are formed.

Another important advantage of the present invention is that the storage regions can be stacked vertically. FIG. 5c shows a chalcogenide memory according to an embodiment of the present invention, in which three storage regions are stacked vertically. Symbol 100 refers to a semiconductor substrate and symbol 120 a conductive layer. The memory device includes a first side electrode 720, a second side electrode 740, and three levels of storage regions 400a, 400b, and 400c, which are disposed between the first and second side electrodes 720 and 740, stacked vertically, and separated from each other by dielectric layers 160b and 160c. The first level of storage region 400a is separated from the conductive layer 120 by a dielectric layer 160a.

The storage regions 400a, 400b, and 400c in FIG. 5c have the same structures as the storage region 400 in FIG. 3h, and redundant descriptions are omitted here. Referring back to FIG. 3h, for a single storage region 400, the side electrodes 200 and 300, diodes 220 and 320, chalcogenide layer 520, and upper electrode 540 are disposed laterally. Therefore, a single storage region 400 occupies a smaller vertical space compared with conventional chalcogenide memory. Thus, many storage regions, for example, three levels of storage regions 400a, 400b, and 400c in FIG. 5c, can be stacked vertically, while still occupying a small vertical space. Thus, multiple bits can be stored in one cell and the memory has super high memory density. It can be seen in FIG. 5c that six bits are stored in one cell.

The process for fabricating the chalcogenide memory of FIG. 5c is similar to that for fabricating the chalcogenide memory of FIG. 3h. Therefore, cross-sections illustrating the process flow of fabricating the chalcogenide memory of FIG. 5c and detailed descriptions are omitted to avoid redundancy.

Figure 5A:
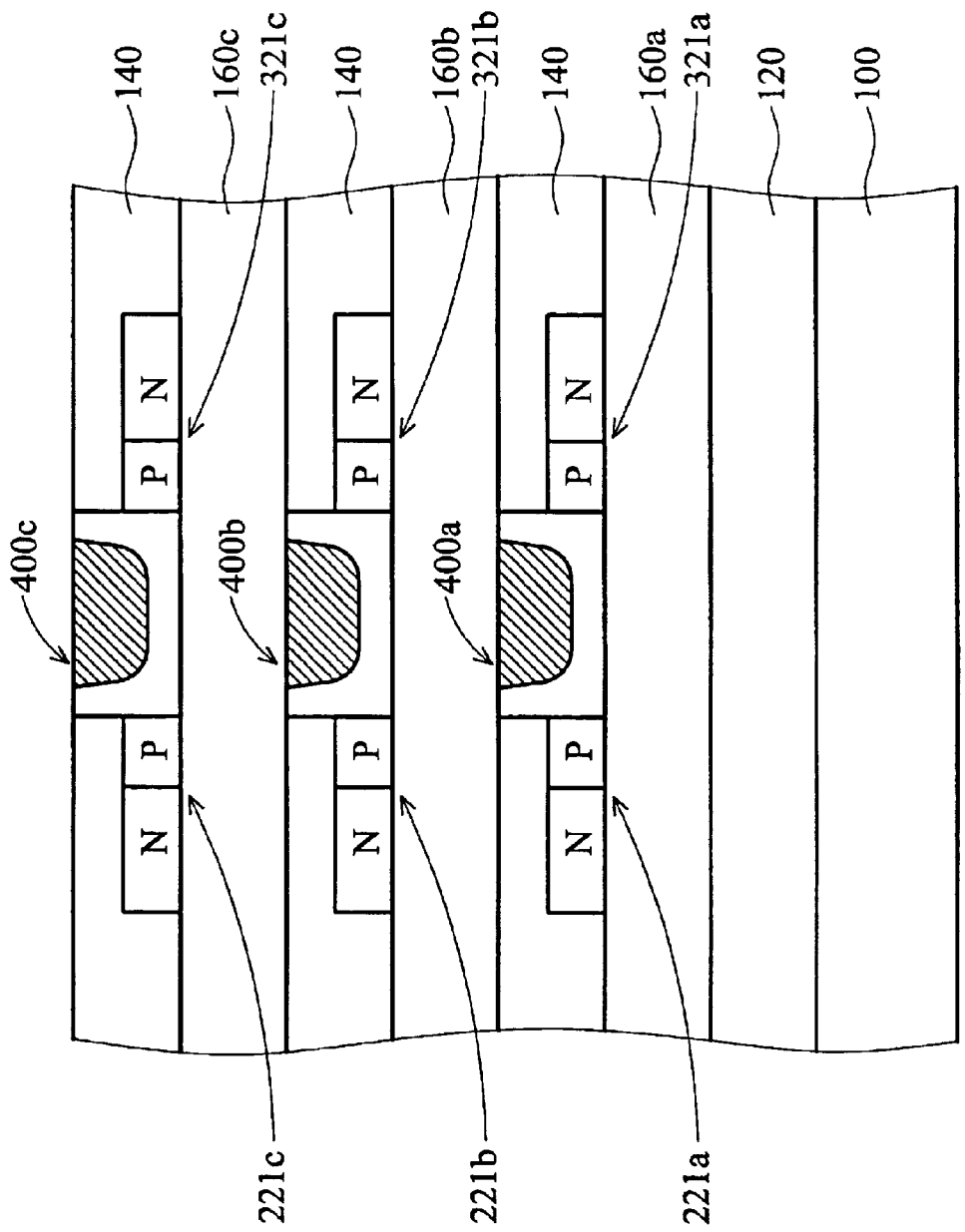
FIGS. 5a to 5c are cross-sections showing the process flow of fabricating a multi-layer chalcogenide memory according to an embodiment of the present invention.

First, referring to FIG. 5a, a first polysilicon layer 120 and a first dielectric layer 160a are sequentially formed on a semiconductor substrate 100. Next, a storage region 400a is formed according to the same steps for forming the storage region 400 in FIG. 3h.

Subsequently, a second dielectric layer 160b, a second level of storage region 400b, a third dielectric layer 160c, and a third level of storage region 400c are sequentially formed. Symbol 140 refers to an insulating layer. Symbols 221a and 321a refer to the first level of diodes, symbols 221b and 321b the second level of diodes, and symbols 221c and 321c the third level of diodes.

Figure 5B:
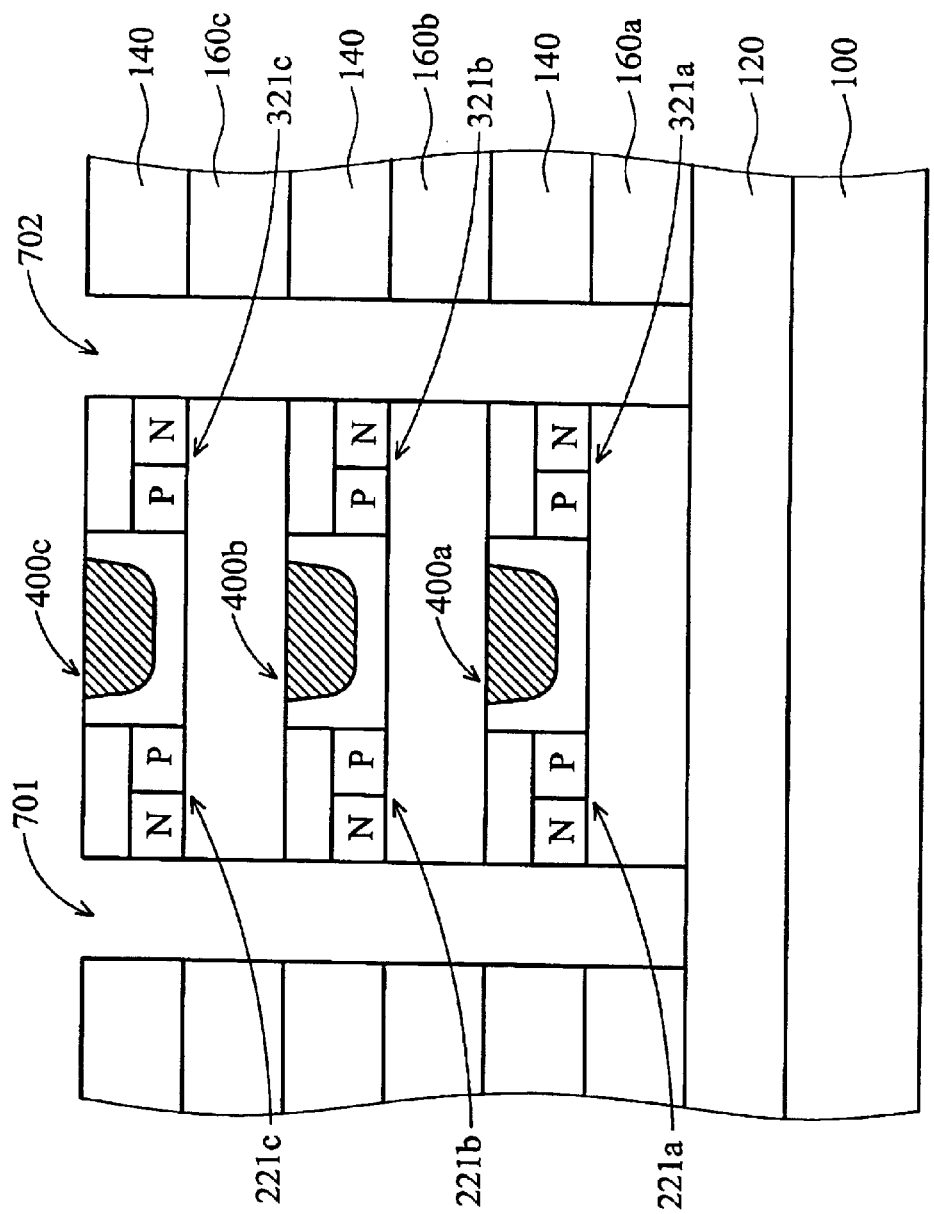
Figure 5C:
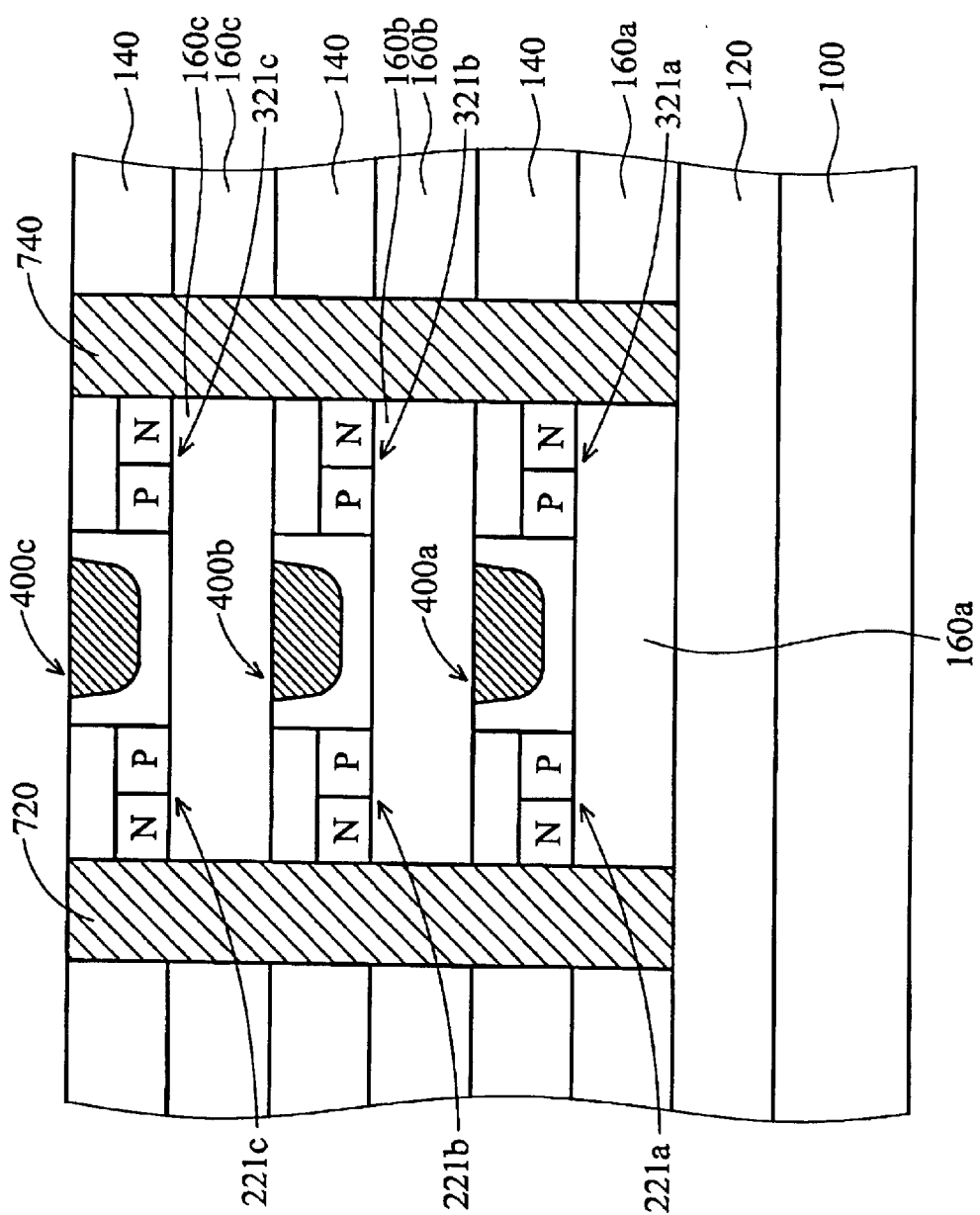

Subsequently, referring to FIG. 5b, three levels of insulating layers 140 and three levels of dielectric layers 160a, 160b, and 160c are selectively removed to expose the sides of three levels of diodes 221a, 321a, 221b, 321b, 221c, and 321c and the top surface of the conductive layer 120, thus forming two openings 701 and 702.

Subsequently, referring to FIG. 5c, a conductive material, such as tungsten, is filled into the two openings 701 and 702 to form two conductive plugs 720 and 740.

In conclusion, in the chalcogenide memory of the present invention, the side electrode, diode, chalcogenide layer, and upper electrode are disposed laterally. Therefore, a single storage region occupies a smaller vertical space compared with conventional chalcogenide memory. Thus, many storage regions can be stacked vertically. Thus, multiple bits can be stored in one cell and the memory has super high memory density.

Moreover, the contact area between the chalocogenide layer and electrode is controlled by the thickness of the diode. Thus, the contact area is reduced to a minimum dimension below the photolithographic limit. This can reduce the required energy input to the chalcogenide active region in operation, thus providing an energy-saving chalcogenide memory.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory device with multiple bits per cell, comprising:
    a side electrode;
    a doped semiconductor region disposed laterally in contact with a sidewall of the side electrode, such that the doped semiconductor region forms a diode, or the junction between the side electrode and the doped semiconductor region forms a diode;
    a layer of phase-changing material disposed laterally in contact with a sidewall of the doped semiconductor region, such that the doped semiconductor region is disposed between the layer of phase-changing material and the side electrode; and
    an upper electrode disposed on the layer of phase-changing material.

2. The memory device as claimed in claim 1, wherein the doped semiconductor region forms a diode.

3. The memory device as claimed in claim 2, wherein the doped semiconductor region is a PN junction diode.

4. The memory device as claimed in claim 3, wherein the side electrode is metal.

5. The memory device as claimed in claim 4, wherein the side electrode is a tungsten plug.

6. The memory device as claimed in claim 1, wherein the junction between the side electrode and the doped semiconductor region forms a diode.

7. The memory device as claimed in claim 6, wherein the side electrode is doped polysilicon having a different conductive type from the doped semiconductor region to form a PN junction diode with the doped semiconductor region.

8. The memory device as claimed in claim 7, wherein the side electrode is a doped polysilicon plug.

9. The memory device as claimed in claim 6, wherein the side electrode is metal to form a Schottky diode with the doped semiconductor region.

10. The memory device as claimed in claim 9, wherein the side electrode is a tungsten plug.

11. The memory device as claimed in claim 1, wherein the phase-changing material is a chalcogenide material.

12. The memory device as claimed in claim 1, wherein the upper electrode is metal.

13. The memory device as claimed in claim 1, wherein the doped semiconductor region has a thickness of 10 Å to 1500 Å.

14. The memory device as claimed in claim 13, wherein the doped semiconductor region has a thickness of 100 Å to 1000 Å.

15. A memory device with multiple bits per cell, comprising:
    a first side electrode;
    a second side electrode; and
    a storage region laterally disposed between the first and second side electrodes,
    wherein the storage region includes:
    a first doped semiconductor region disposed laterally in contact with a sidewall of the first side electrode, such that the first doped semiconductor region forms a diode, or the junction between the first side electrode and the first doped semiconductor region forms a diode;
    a second doped semiconductor region disposed laterally in contact with a sidewall of the second side electrode, such that the second doped semiconductor region forms a diode, or the junction between the second side electrode and the second doped semiconductor region forms a diode;
    a layer of phase-changing material disposed laterally between and in contact with the first and second doped semiconductor regions; and
    an upper electrode disposed on the layer of phase-changing material.

16. The memory device as claimed in claim 15, wherein the memory device includes:
    a first-side electrode;
    a second side electrode; and
    a plurality of the storage regions disposed between the first and second side electrodes, stacked vertically, and separated from each other by a dielectric layer.

* * * * *